United States Patent
Mizumura et al.

(10) Patent No.: US 7,026,252 B2
(45) Date of Patent: Apr. 11, 2006

(54) ETCHING AFTERTREATMENT METHOD

(75) Inventors: Michinobu Mizumura, Kudamatsu (JP); Ryouji Fukuyama, Kudamatsu (JP); Mamoru Yakushiji, Kudamatsu (JP); Yutaka Ohmoto, Hikari (JP); Katsuya Watanabe, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 135 days.

(21) Appl. No.: 10/372,271

(22) Filed: Feb. 25, 2003

(65) Prior Publication Data

US 2004/0147130 A1    Jul. 29, 2004

(51) Int. Cl.
*H01L 21/302* (2006.01)
(52) U.S. Cl. ............... 438/714; 438/715; 438/725; 216/63; 216/67; 216/79
(58) Field of Classification Search ................ 216/63, 216/67, 79; 438/706, 707, 710, 714, 715, 438/725
See application file for complete search history.

(56) References Cited

U.S. PATENT DOCUMENTS 5,578,163 A * 11/1996 Yachi ..................... 438/696
6,037,250 A * 3/2000 Matsubara ............... 438/622
6,168,726 B1 * 1/2001 Li et al. ..................... 216/79
2003/0075524 A1 * 4/2003 Kawaguchi et al. ......... 216/67

OTHER PUBLICATIONS

Wolf, Semiconductor Processing for the VLSI Era, 2002, vol. 4, Lattice Press, pp. 639, 650, 653-54.*
Wolf, Silicon Processing for the VLSI Era, 2002, Lattice Press, vol. 4, pp. 671-72.*

* cited by examiner

Primary Examiner—Nadine G. Norton
Assistant Examiner—Eric B. Chen
(74) Attorney, Agent, or Firm—Antonelli, Terry, Stout and Kraus, LLP.

(57) ABSTRACT

After etching a Si-containing low permittivity insulating film with chlorine based gas, the etched wafer is subjected to an etching aftertreatment process comprising introducing oxygen gas to a vacuum processing chamber with a pressure as low as 0.2 Pa to 1 Pa and a flow rate as low as 5 cc to 20 cc/min, generating plasma within the chamber, heating the wafer 2 being subjected to aftertreatment between 50° C. and 200° C., applying a wafer bias power within the range of 50 W to 200 W, and exposing the wafer to the generated plasma, thereby simultaneously removing the photoresist components, the antireflection film components and the halogen components.

4 Claims, 4 Drawing Sheets

BEFORE ETCHING

AFTER ETCHING

BEFORE ETCHING

AFTER ETCHING

O₂ TREATMENT (A)

O₂ TREATMENT (B)

O₂ TREATMENT (C)

ETCHING AFTERTREATMENT METHOD

FIELD OF THE INVENTION

The present invention relates to an aftertreatment method to be performed to a wafer after etching, and especially relates to an aftertreatment method to be performed after a chlorine based etching of a low permittivity insulating film forming the wiring of semiconductor LSI chips, the method being capable of cleaning the surface of the wafer without deteriorating the properties of the film.

DESCRIPTION OF THE RELATED ART

As the semiconductor LSI advances in speed, the wiring material is changed to Cu for miniaturization and lower resistance. Since dry etching of a Cu film is technically difficult, a damascene process is recently put in practice, according to which an interlayer insulating film surrounding the wiring is etched first into the shape of the wiring, and then Cu is embedded in the trench or hole formed by the etching via a plating process and the like, and the Cu is planarized via a CMP (chemical mechanical polishing) to remove the excess Cu disposed above the wiring. Especially, a dual damascene process is preferably adopted according to which contact holes reaching the lower layer wiring are formed simultaneously when etching the wiring trenches.

Along with the miniaturization of the wiring design, there is an increasing demand to lower the relative permittivity of the insulating film in order to decrease inter-wiring capacity to therefore prevent signal delay and crosstalk with surrounding wirings. In response to this demand, various insulating film materials having low permittivity are developed for inter-layer insulating films. The relatively popular Si-containing low permittivity insulating film comprising elements of Si, C, O and H is formed by introducing methyl ($—CH_3$) to the conventional $SiO_2$ film to thereby reduce polarization and lower permittivity. The introduction of methyl also reduces film density, but conventionally, the Si-containing low permittivity insulating film was etched using the same CF-system process for etching the $SiO_2$ oxide film.

After this etching process, a photoresist functioning as the etching mask and an antireflection film disposed to improve the exposure resolution of the photoresist remains on the etched object, and the CF based deposits which are deposited on the photoresist and etching side walls to improve selectivity and the reaction products generated by the etching are adhered on the etched object.

Conventionally, these residuals are removed by an aftertreatment process for removing the photoresist and the antireflection film using oxygen, nitrogen or mixed gas, and then the remaining residuals are removed by a cleaning process using chemical solutions.

An etching process utilizing chlorine gas as etching gas is disclosed (refer for example to non-patent document 1). The etching process using chlorine generates smaller amount of deposits compared to the CF based process, but leaves chlorine as residual. Therefore, an aftertreatment must be performed after the chlorine etching to remove the photoresist, the antireflection film, the reaction products and the residual chlorine.

The etching process utilizing the CF based gas for etching the most common Si-containing low permittivity film requires a high output power source with the wafer bias during etching being as high as 1 kW to 3 kW, since the CF based gas has a strong deposition property for improving the selectivity and side wall protection. Moreover, the etching process utilizing the CF based gas requires a chiller with a high cooling performance to cool the wafer and remove the input heat. Therefore, according to the conventional etching system, high running cost is required.

On the other hand, the etching process using chlorine has a weaker deposition property and the wafer bias is as low as 100 W to 200 W, so the running cost of the etching process can be cut down. However, according to the process, chlorine remains on the etched surface. Residual chlorine may cause corrosion when a chlorine based process is used for etching aluminum wirings, but by treating the object to be etched with plasma containing both hydrogen and oxygen components, the amount of residual chlorine and remaining photoresist may be reduced at the same time. However, the process must be performed under a pressure as high as 186 Pa, an oxygen flow rate as high as 400 cc/min and a methanol flow rate as high as 80 cc/min in order to improve the removal rate (refer for example to patent document 1). If these processing conditions are applied to the processing of a Si-containing low permittivity insulating film, the properties of the film will be degraded.

In particular, the methyl introduced to lower the permittivity of the film will be eliminated by oxygen, by which a damaged layer is formed to the processed object and the permittivity of the object is increased as a whole. Furthermore, the damaged layer will increase the hygroscopicity of the object, causing leak current to increase.

Patent Document 1
    Japanese Patent Publication No. 7-093293

Non-Patent Document 1
    Journal of Vacuum Science Technology A20 p. 651

SUMMARY OF THE INVENTION

Therefore, the present invention aims at providing an aftertreatment method for removing from the surface of a Si-containing low permittivity insulating film the photoresist and antireflection film, the reaction products deposited on the etched surface, the deposits formed by the etching gas and the residual chlorine remaining on the surface of the film after the chlorine based gas etching, without damaging the Si-containing low permittivity insulating film.

The object of the present invention is achieved by an aftertreatment process comprising etching a Si-containing low permittivity insulating film using chlorine based gas, introducing oxygen gas into a processing chamber with a pressure as low as 0.2 Pa to 1 Pa and a flow rate as low as 5 cc/min to 20 cc/min, generating plasma, and exposing the wafer to be subjected to the aftertreatment to the generated plasma with a wafer temperature set to 50° C. to 200° C. and having a bias of 50 W to 200 W applied thereto, so as to remove the photoresist components, the antireflection film components and the halogen components simultaneously.

DETAILED DESCRIPTION OF THE PREFERRED EMBODIMENT

Figure 1:
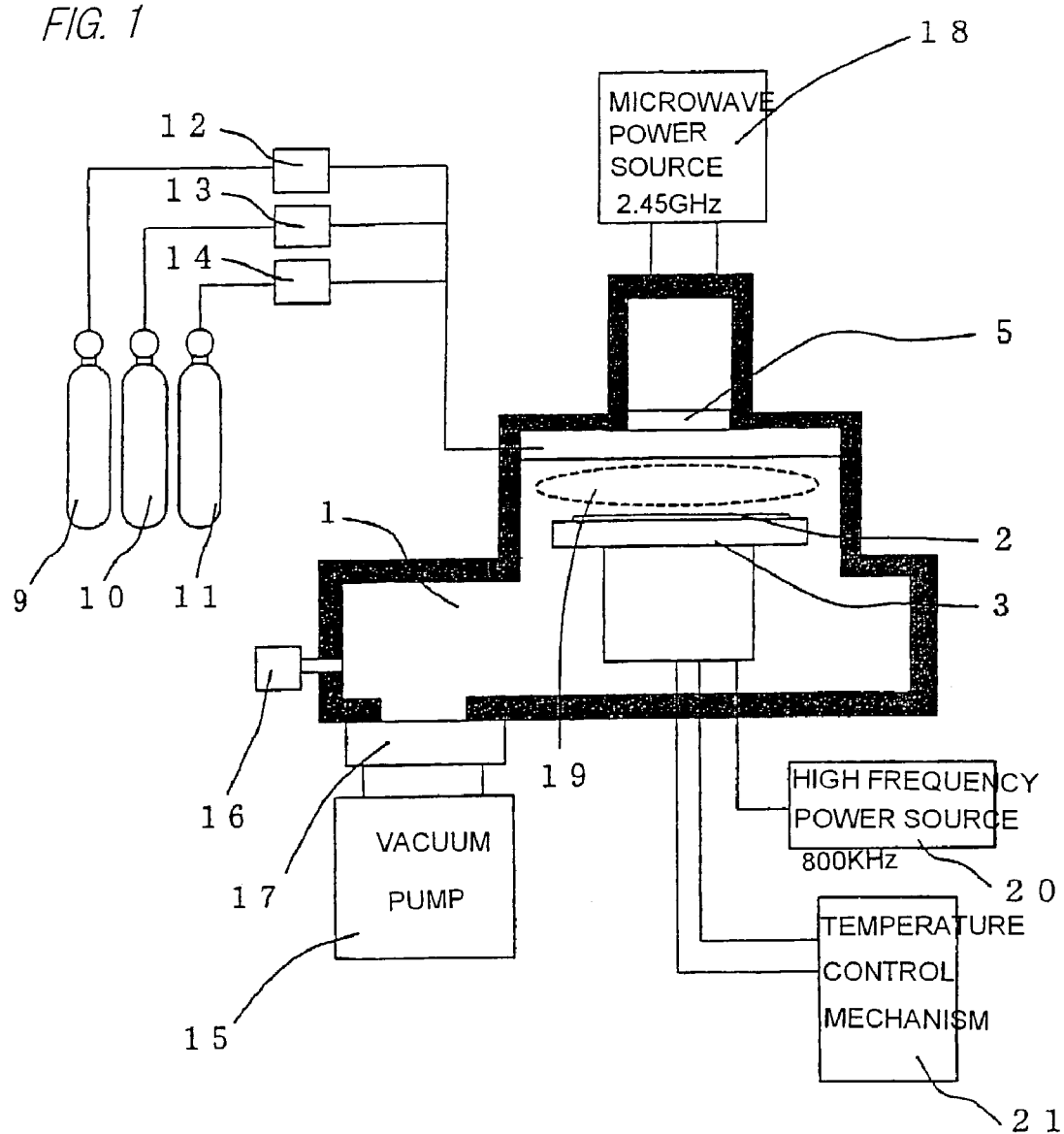
FIG. 1 is a schematic cross-sectional view of an aftertreatment apparatus used after an etching process according to the present invention.

The preferred embodiment of the present invention will now be explained with reference to FIGS. 1 through 8. FIG. 1 illustrates a schematic structure of an apparatus to which the present etching aftertreatment method is applied.

The apparatus comprises a processing chamber 1 capable of maintaining a vacuum state, and in the processing chamber 1 is disposed a sample stage 3 for mounting a wafer 2 to be formed into a semiconductor LSI chip, which is the sample being subjected to the aftertreatment. The sample stage 3 has an electrode structure capable of applying voltage, and is equipped with a heat control mechanism 21 for controlling the temperature of the sample being subjected to the aftertreatment using a heater and a cooling medium. An aftertreatment gas is supplied from a compressed gas cylinder 9 through a piping and via a flow control valve 12, and is introduced into the processing chamber 1 via a piping with a controlled flow rate corresponding to the aftertreatment conditions. If oxygen gas is to be mixed for example with hydrogen gas, the hydrogen gas is filled in a gas cylinder 10 and supplied to the processing chamber via a flow control valve 13. The present apparatus can also be used to perform etching, so etching gas can be filled in a gas cylinder 11, which is supplied to the process chamber via a flow control valve 14 when performing etching.

The gas being supplied to the processing chamber 1 resides in the chamber 1 for a period of time then discharged from the chamber 1 via a vacuum pump 15. At this time, the pressure within the processing chamber 1 is measured by a vacuum gauge 16 equipped inside the chamber 1, and a vacuum speed control valve 17 is operated so that the pressure within the chamber maintains a constant value. When the gas flow and the pressure are stably maintained at desirable levels, a 2.45 GHz microwave is supplied to the chamber from a microwave power source 18 via a silicon dioxide 5. By this microwave power, the gas within the processing chamber 1 turns into plasma 19. Simultaneously as when the plasma 19 is generated, a high frequency power of 800 kHz is supplied to the sample stage 3 from a high frequency power source 20, by which high frequency voltage is applied to the sample being subjected to the aftertreatment.

Figure 2:
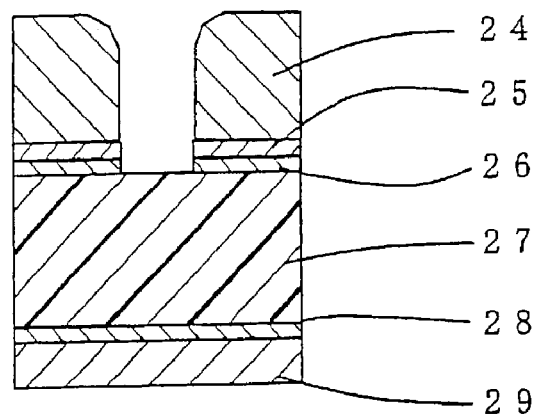
FIG. 2 is a cross-sectional view of a damascene sample applying a Si-containing low permittivity insulating film as a wiring layer.

The cross-sectional view of FIG. 2 is used to explain the layer structure of a portion of the wafer (sample to be subjected to aftertreatment) prior to being subjected to etching. The wafer prior to being subjected to etching comprises a silicon wafer 29, a SiC film having a thickness of 50 nm being disposed on the silicon wafer 29 as base film 28, and a Si-containing low permittivity film 27 such as an organosilicate glass film having a thickness of 400 nm being disposed on the SiC film. Further, a $SiO_2$ film having a thickness of 50 nm is disposed as hard mask 26 to the wafer to provide tolerance against the mechanical stress being received by the wafer during CMP and other planarization processes. Moreover, an antireflection film 25 having a thickness of 50 nm is disposed on the hard mask 26 to improve the resolution during exposure of a photoresist 24 formed into a trench pattern.

Figure 3:
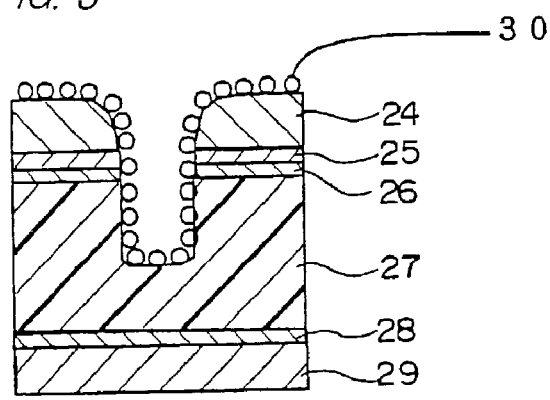
FIG. 3 is a cross-sectional view showing the damascene sample being etched by a chlorine based gas.

FIG. 3 is used to explain the cross-sectional shape of the wafer showing the state after the Si-containing low permittivity film 27 is etched with chlorine based gas. A preferable trench shape can be obtained by appropriately setting the parameters of the apparatus, but reaction products formed of C, H, O, N and the like and residual chlorine 30 are adhered on the surface of the etched Si-containing low permittivity film 27 and the photoresist 24.

Figure 8:
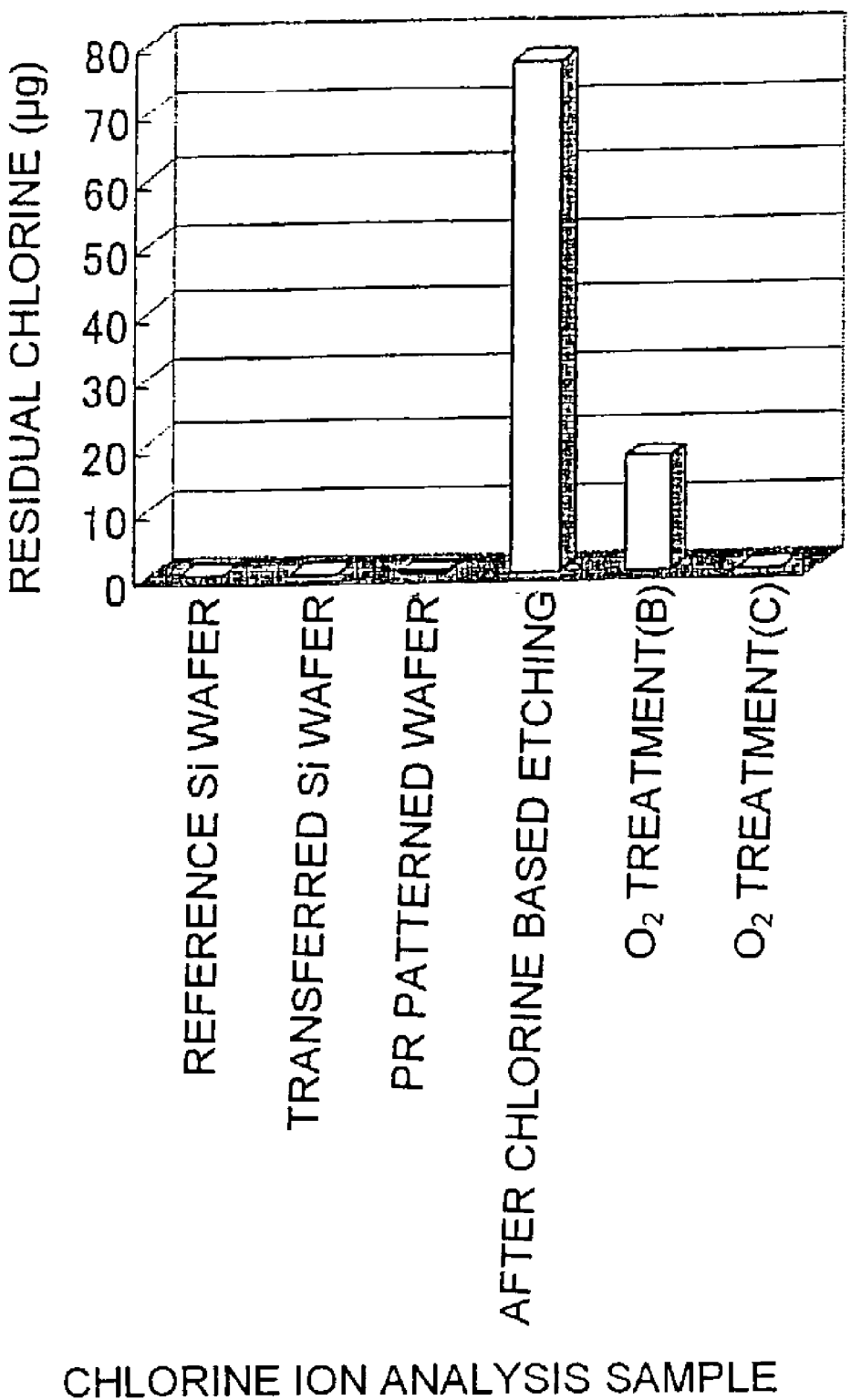
FIG. 8 shows the amount of residual chlorine on the sample at each stage of the treatment after etching the sample with chlorine based gas.

FIG. 8 shows the result of evaluation of the amount of residual chlorine ions adhered on the wafer measured by ion chromatography after etching the Si-containing low permittivity film 27 with chlorine based gas. It is clear from FIG. 8 that the amount of chlorine is not increased from the reference wafer when the wafer is transferred within the apparatus from a load lock (not shown) to the processing chamber 1, and then from chamber 1 to an unload lock, but in contrast, when the wafer is subjected to chlorine based etching, over 70 μg of chlorine ions remain on the wafer as residual.

Conditions for removing the remaining photoresist 24, the antireflection film 25, the reaction products and the residual chlorine 30 are shown in Table 1.

TABLE 1

| No | Treatment | Gas | Flow (cc/min) | Pressure (Pa) | Wafer bias(W) | Wafer temperature (° C.) |
|---|---|---|---|---|---|---|
| 1 | $O_2$ treatment (A) | $O_2$ | 400 | 186 | 0 | 250 |
| 2 | $O_2$ treatment (B) | $O_2$ | 20 | 0.3 | 300 | 20 |
| 3 | $O_2$ treatment (C) | $O_2$ | 20 | 0.3 | 100 | 80 |
| 4 | $NH_3$ treatment | $NH_3$ | 200 | 0.5 | 200 | 20 |
| 5 | $N_2/H_2$ treatment | $N_2/H_2$ | 50/150 | 0.5 | 200 | 20 |

Figure 4:
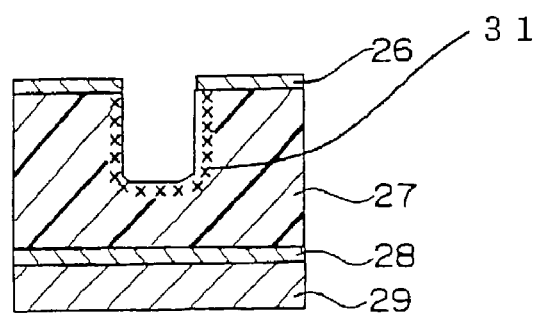
FIG. 4 is a cross-sectional view of the damascene sample having been after-treated with oxygen treatment (A)
Figure 7:
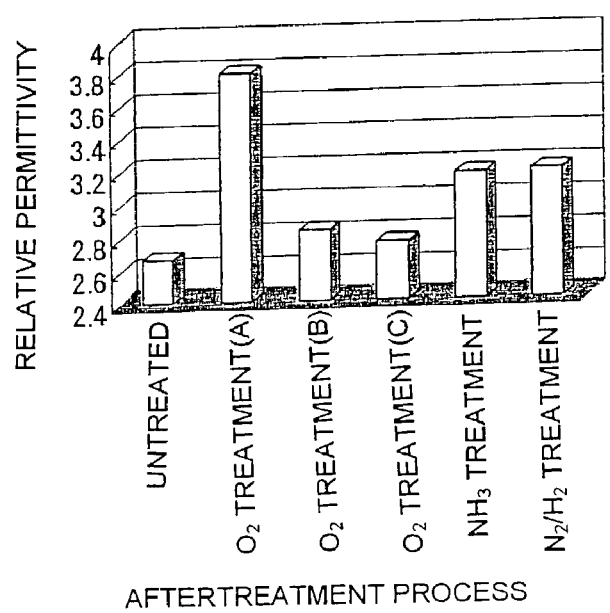
FIG. 7 illustrates the relative permittivity of a Si-containing low permittivity insulating film having been treated under various aftertreatment conditions.

FIG. 4 is used to explain the result of the aftertreatment performed to the wafer according to condition No. 1 shown in Table 1. Condition No. 1 is used for the aftertreatment of an aluminum film etching, and according to this treatment, the photoresist 24, the antireflection film 25 and the reaction products or residual chlorine 30 were successfully removed, but a damaged layer 31 is created to the surface of the Si-containing low permittivity film 27. This damaged layer is created by the methyl radicals introduced to the Si-containing low permittivity film 27 reacting with oxygen radicals and being eliminated, and causes the relative permittivity to rise. This damaged layer 31 has high hygroscopicity, and causes the increase of leak current. The actually measured relative permittivity is significantly higher than that of the untreated wafer as shown in FIG. 7, and reaches a value close to the relative permittivity of $SiO_2$.

Figure 5:
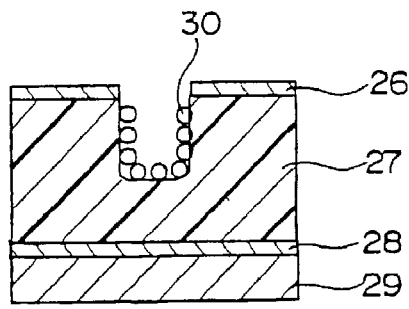
FIG. 5 is a cross-sectional view of the damascene sample having been after-treated with oxygen treatment (B)
Figure 6:
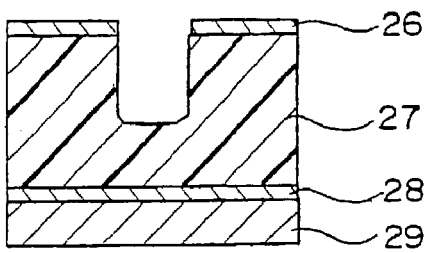
FIG. 6 is a cross-sectional view of the damascene sample having been after-treated with oxygen treatment (C)

The $O_2$ treatment (B) of condition No. 2 in Table 1 is executed to reduce this damaged layer 31. Condition No. 2 is set to lower the oxygen flow and reduce pressure so as to reduce the amount of oxygen radicals causing elimination of methyl radicals, and the wafer temperature is lowered to normal temperature while bias voltage is applied to the wafer to compensate for the low temperature, thus preventing deterioration of the rate of removal. As a result, the damaged layer almost disappears as shown in FIG. 5, and the increase of relative permittivity is suppressed as shown in FIG. 7. However, as illustrated in FIG. 8, according to condition No. 2, the amount of residual chlorine is only reduced to about 1/3 of the amount prior to aftertreatment, and chlorine remained on the treated surface.

Thus, the present inventors examined whether residual chlorine could be further reduced according to condition No. 3 of Table 1 where the wafer temperature is raised from room temperature to 80° C. As a result, as shown in FIG. 8, the residual chlorine is reduced to the level observed prior to the etching process, and according to this treatment, a very good surface shape is achieved. During this treatment, the wafer bias power is reduced to 100 W, according to which the increase of relative permittivity is suppressed, and the damaged layer could be reduced. As illustrated in FIG. 7, the relative permittivity is reduced substantially to the level prior to the treatment.

Other conditions were tested and evaluated, wherein condition No. 4 utilizes $NH_3$ used relatively often for etching organic films, and condition No. 5 utilizes $N_2/H_2$ gas. According to these conditions, however, the relative permittivity was increased as shown in FIG. 7.

From the above results, the present invention requires the flow rate of gas introduced into the processing chamber as aftertreatment gas to be between 5 cc and 20 cc/min, and for the pressure within the processing chamber after the introduction of gas to be within 0.2 Pa and 1 Pa.

The removal speed of the photoresist and antireflection film is considered to be determined by the balance between the ionic action and the radical action within the plasma. As for the ratio of the amount of ions and radicals generated in the plasma, the radical ratio tends to be high when the gas flow rate is high or processing pressure is high, and the ion ratio tends to rise when the flow rate is low or processing pressure is low.

The present invention aims at utilizing the ionic action effectively, and to bring balance to the removal action of the photoresist and the antireflection film by the radicals and the elimination action of the methyl radicals from the low permittivity film.

The elimination speed of the resist and antireflection film is improved when gas flow is increased, but when the amount of oxygen radicals increase, the oxygen radicals cause methyl to be eliminated from the low permittivity film, increasing the permittivity of the film and deteriorating the electric property of the film. When the gas flow is set to 5 cc/min, the removal speed of the photoresist and antireflection film is reduced to approximately 50% the speed when the gas flow is 20 cc/min. If the gas flow is reduced to between 5 cc/min, the removal speed of the photoresist and antireflection film is significantly reduced, which is not preferable.

As for the processing pressure, similar to gas flow, the elimination speed of the resist and antireflection film can be improved when the pressure is increased, but the increase of oxygen radicals cause methyl to be eliminated from the low permittivity film, increasing the permittivity of the film and deteriorating the electric property of the film. The amount of oxygen radicals may be reduced by lowering the processing pressure, but the reduction of oxygen radicals slows down the speed for removing the photoresist and antireflection film, and when the pressure is lowered to below 0.2 Pa the speed is significantly slowed down.

According to the present invention, the temperature of the sample must be set within the range of 50° C. to 200° C. by which temperature the Si-containing low permittivity film will not be degraded. Moreover, the residual chlorine is effectively eliminated if the sample temperature is high, but not sufficiently eliminated when the temperature is below 50° C.

As for the high frequency power applied to the sample according to the present invention, the wafer bias power should fall within the range of 50 W to 200 W creating ion energy that does not cause degradation of the Si-containing low permittivity film.

If the low permittivity film is formed to have a step-like shape with a recession, the ion energy will act concentratedly on the surface of the low permittivity film, causing deterioration of the film performance if excessive energy acts on the surface. Therefore, the high frequency power to be applied to the sample should be determined so that the wafer bias power is between 50 W and 200 W causing ion energy that will not deteriorate the Si-containing low permittivity film.

Therefore, the above-explained processing conditions are most appropriate according to the present invention.

Furthermore, the photoresist 24, the antireflection film 25 and the reaction products or residual chlorine 30 can be removed without generating a damaged layer by filling the compressed gas cylinder 10 with hydrogen gas and supplying the hydrogen gas to the processing chamber through the flow control valve 13 together with oxygen gas. Instead of supplying and mixing oxygen gas and hydrogen gas, gasified $H_2O$ can be introduced to the chamber.

Although according to the present invention the sample is etched and then subjected to aftertreatment in the same processing chamber, but it is also possible for the sample to be etched in a different etching apparatus and then transferred to the present apparatus to be subjected to aftertreatment.

Moreover, the disclosed aftertreatment apparatus utilizes microwaves, but the present invention can be applied to other types of apparatuses such as RIE apparatuses.

According to the present invention, the deposits including the chlorine component, the photoresist and the antireflection film remaining on the sample after the etching of the Si-containing low permittivity insulating film using chlorine based gas are removed effectively without deteriorating the insulating film. Thus, the present invention can provide a damascene structure comprising a hard mask and a low permittivity insulating film without changing the electrical properties of the film.

What is claimed is:

1. An etching aftertreatment method comprising:
    etching a sample having a laminated wiring structure including a Si-containing low permittivity insulating film with a halogen based gas, said etching leaving photoresist components, antireflection film components and halogen components on a surface of the Si-containing low permittivity insulating film;
    after said etching, introducing an oxygen gas or an oxygen gas with hydrogen gas to a processing chamber;
    generating plasma within the processing chamber having had said oxygen gas or said oxygen gas with hydrogen gas introduced thereto;
    simultaneously applying high frequency voltage to the sample; and
    exposing the sample to the plasma so as to remove the photoresist components, the antireflection film components and the halogen components from the surface of the Si-containing low permittivity insulating film, wherein the oxygen gas or the oxygen gas with the hydrogen gas introduced to the chamber as an aftertreatment gas has a flow rate between 5 cc and 20 cc/min, and pressure within the processing chamber after the introduction of the aftertreatment gas is between 0.2 Pa and 1 Pa, wherein a temperature of the sample is set between 50° C. and 200° C. according to which the Si-containing low permittivity insulating film will not be deteriorated, and wherein the high frequency voltage applied to the sample is set so that a wafer bias power ranges between 50 W and 200 W creating ion energy that will not deteriorate the Si-containing low permittivity insulating film.

2. An etching aftertreatment method according to claim 1, wherein the Si-containing low permittivity insulating film is constituted of Si, O, C and H elements.

3. An etching aftertreatment method according to claim 1, wherein the halogen bassed gas is a gas including either a chlorine gas or a chlorine component.

4. An etching aftertreatment method according to claim 1, wherein in said etching the sample, the Si-containing low permittivity insulating film is etched.

* * * * *